(12) United States Patent
Imahashi et al.

(10) Patent No.: US 7,202,531 B2
(45) Date of Patent: Apr. 10, 2007

(54) SEMICONDUCTOR DEVICE

(75) Inventors: Manabu Imahashi, Osaka (JP);
Hiroyoshi Ogura, Kyoto (JP);
Masakatsu Nawate, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 93 days.

(21) Appl. No.: 11/085,208

(22) Filed: Mar. 22, 2005

(65) Prior Publication Data

US 2005/0230761 A1    Oct. 20, 2005

(30) Foreign Application Priority Data

Apr. 16, 2004   (JP)   ............... 2004-121339

(51) Int. Cl.
*H01L 23/62* (2006.01)
(52) U.S. Cl. .................... 257/355; 257/361
(58) Field of Classification Search .......... 257/355, 257/361–363, 173–174, 358
See application file for complete search history.

(56) References Cited

U.S. PATENT DOCUMENTS 6,306,695 B1 * 10/2001 Lee et al. ................ 438/152
6,472,286 B1 * 10/2002 Yu ............................ 438/342

FOREIGN PATENT DOCUMENTS

JP   61-189662   8/1986
JP   10-256484   9/1998

* cited by examiner

*Primary Examiner*—Theresa T. Doan
(74) *Attorney, Agent, or Firm*—McDermott Will & Emery LLP

(57) ABSTRACT

A semiconductor device includes an output pad and a surge absorption unit formed above a semiconductor region of a first conductivity type. The surge absorption unit includes: a semiconductor island region of a second conductivity type; a buried layer of the second conductivity type formed between a bottom of the semiconductor island region of the second conductivity type and the semiconductor region of the first conductivity type; a dopant layer of the first conductivity type formed in an upper portion of the semiconductor island region of the second conductivity type and connected to have the same potential as the semiconductor region of the first conductivity type; a dopant layer of the second conductivity type formed in an upper portion of the dopant layer of the first conductivity type and electrically connected to the output pad; and a ring layer of the second conductivity type surrounding the dopant layer of the first conductivity type and reaching the buried layer of the second conductivity type. In this device, the ring layer of the second conductivity type is electrically connected to a terminal with a fixed potential and contains a dopant of the second conductivity type having a higher concentration than the semiconductor island region of the second conductivity type.

9 Claims, 12 Drawing Sheets

SEMICONDUCTOR DEVICE

CROSS-REFERENCE TO RELATED APPLICATIONS

This application claims priority under 35 U.S.C. § 119 on Patent Application No. 2004-121339 filed in Japan on Apr. 16, 2004, the entire contents of which are hereby incorporated by reference.

BACKGROUND OF THE INVENTION (a) Fields of the Invention

The present invention relates to semiconductor devices, and in particular to electrostatic protection semiconductor devices capable of protecting their internal elements against breakdown due to an electrostatic surge or the like.

(b) Description of Related Art

Recently, with increasing packing density and decreasing power consumption of a semiconductor integrated circuit device, a driver for driving an inductive load has also been requested to increase the packing density and decrease the power consumption.

Herein, the inductive load is a load to which a voltage is applied from outside to pass a current and to generate an induced voltage having a polarity opposite to that of the applied voltage. A concrete example of the inductive load is a motor.

However, a semiconductor device having a driver for driving the inductive load formed therein requires avoiding misoperation of a driver element for driving the inductive load and of an element directly connected to that element.

One exemplary technique for attaining this object is disclosed in Japanese Unexamined Patent Publication No. S61-189662 (referred hereinafter to as Document 1). This technique disclosed is that an island region is provided between a driver element and other circuit elements and the potential of the island region is kept high to prevent misoperation of these elements. Another exemplary technique is disclosed in Japanese Unexamined Patent Publication No. H10-256484 (referred hereinafter to as Document 2). This technique disclosed is that a surge protection element is placed sufficiently away from a driver element.

The technique for avoiding misoperation mentioned in Document 1 will be described below with reference to the accompanying drawings.

FIG. 8 is an equivalent circuit diagram of a semiconductor device mentioned in Document 1.

The semiconductor device includes an output pad 11 electrically connected to an inductive load (not shown), and a driver element 12 electrically connected to the output pad 11 and supplying a current. At a connecting point N11 positioned between the output pad 11 and the driver element 12, a negative surge absorbing unit 13 and a positive surge absorbing unit 14 are electrically connected to each other.

In this device, the negative surge absorbing unit 13 is provided with a negative surge protection diode 15 and a GND (grounding) terminal 16. The negative surge protection diode 15 has a cathode 15K electrically connected to the connecting point N11 and an anode 15A connected to the GND terminal 16. With such a configuration, if the output pad 11 has a negative potential to generate a surge, the negative surge protection diode 15 is activated to absorb the negative surge.

The positive surge absorbing unit 14 is provided with a positive surge protection diode 17 and a power supply terminal 18. The positive surge protection diode 17 has a cathode 17K connected to the power supply terminal 18 and an anode 17A electrically connected to the connecting point N11. With such a configuration, if the output pad 11 has a positive potential to generate a surge, the positive surge protection diode 17 is activated to absorb the positive surge.

Next, FIGS. 9 and 10 are views showing the structure of the negative surge absorbing unit 13 and its peripheral portion in the semiconductor device. FIG. 9 is a sectional view and FIG. 10 is a plan view. In these figures, other components of the semiconductor device shown in FIG. 8, such as the output pad 11 and the driver element 12, are provided at locations in the device which are not shown in FIGS. 9 and 10.

In the semiconductor device 20 shown in FIG. 9, an n-type epitaxial layer 22 is formed on a p-type semiconductor substrate 21, and LOCOS (local oxidation of silicon) films 23 are formed at predetermined positions on the surface of the n-type epitaxial layer 22. The n-type epitaxial layer 22 is divided into multiple regions by a p-type isolation layer 24. To be more specific, the p-type isolation layer 24 defines a protection diode region 25, an n-type peripheral region 26, a control circuit region 27, and other regions.

In this structure, the p-type isolation layer 24 is composed of a heavily p-doped layer 24a formed in and below the surface of the n-type epitaxial layer 22, a p-type upper isolation layer 24b formed below the heavily p-doped layer 24a, and a p-type lower isolation layer 24c formed below the p-type upper isolation layer 24b to extend across the p-type semiconductor substrate 21 and the n-type epitaxial layer 22.

In each of the protection diode region 25, the n-type peripheral region 26 and the control circuit region 27, an n-type buried layer 28 is formed at and through the interface between the p-type semiconductor substrate 21 and the n-type epitaxial layer 22.

In each of the protection diode region 25 and the n-type peripheral region 26, the surface of the n-type epitaxial layer 22 is formed with a heavily n-doped layer 29, while in the control circuit region 27, the surface of the n-type epitaxial layer 22 is formed with a p-type resistive layer 30.

An interlayer insulating film 31 is formed to cover the n-type epitaxial layer 22 and the components formed on its surface. The interlayer insulating film 31 is formed with openings, which are formed with contacts 32 for providing electrical connections to the heavily p-doped layer 24a and the heavily n-doped layer 29 of the protection diode region 25, the heavily n-doped layer 29 of the n-type peripheral region 26, and the p-type resistive layer 30.

Note that the connecting point N11, a terminal with a fixed potential V, a terminal with a GND potential, and the like are also shown in FIG. 9. However, these components are shown simply for the purpose of illustrating electrical connections from corresponding portions of the semiconductor device to these components, and these components are not shown as part of the structure of the device.

Also, as shown in FIG. 10, the p-type isolation layer 24 defines the protection diode region 25, the n-type peripheral region 26, and the control circuit region 27 to surround them. Note that the LOCOS film 23 and the interlayer insulating film 31 are omitted in FIG. 10.

In the control circuit region 27, in addition to a resistance element using the p-type resistive layer 30, required electric elements such as a transistor 33 are formed.

In the protection diode region 25 of this device, the contacts 32 provided on the p-type isolation layer 24 are grounded to the GND potential terminal, and the heavily n-doped layer 29 is electrically connected to the connecting point N11. In the n-type peripheral region 26 thereof, the heavily n-doped layer 29 is electrically connected to the fixed potential terminal having a higher potential than the GND potential.

Since the device has the structure described above, the negative surge protection diode 15 is formed in the protection diode region 25 (see also FIG. 8). To be more specific, the negative surge protection diode 15 is formed which uses the p-type isolation layer 24 and the p-type semiconductor substrate 21 as the anode 15A, and the n-type buried layer 28, the n-type epitaxial layer 22, and the heavily n-doped layer 29 as the cathode 15K.

If the output pad 11 electrically connected to the inductive load has a negative potential, a parasitic NPN transistor 51 is activated which is composed of the n-type peripheral region 26, the p-type isolation layer 24 included in the p-type semiconductor substrate 21 and the protection diode region 25, and the heavily n-doped layer 29 of the protection diode region 25. As a consequence of this, a current is supplied mainly from the n-type peripheral region 26 serving as a collector of the parasitic NPN transistor 51, so that only a reduced amount of current flows through the p-type semiconductor substrate 21.

Also in this device, a parasitic thyristor 52 is formed to extend from the p-type resistive layer 30 of the control circuit region 27 to the heavily n-doped layer 29 of the protection diode region 25. This may cause misoperation of the control circuit region 27. However, the parasitic thyristor 52 has a configuration less likely to be activated.

Specifically, part of the p-type semiconductor substrate 21 included in the n-type peripheral region 26 serves as a p-type gate portion. The presence of the n-type peripheral region 26 increases the width of the p-type gate portion. This results in a decreased current gain of the NPN transistor which is part of the parasitic thyristor 52. From the above result, the parasitic thyristor 52 is hard to activate. Therefore, even if the output pad 11 has a negative potential to generate a surge, misoperation of the control circuit region 27 can be prevented.

FIG. 11 is an equivalent circuit diagram of the semiconductor device mentioned in Document 2.

The semiconductor device includes an input/output pad 11a electrically connected to an inductive load, and a control circuit 19. At a connecting point N21 positioned between the input/output pad 11a and the control circuit 19, a negative surge absorbing unit 13 and a positive surge absorbing unit 14 are electrically connected to each other.

Although detailed description of the negative and positive surge absorbing units 13 and 14 is omitted, they have the function of absorbing negative and positive surges, respectively, as in the case of the technique of Document 1 shown in FIG. 8.

The semiconductor device is also provided with a driver element 12. In this device, the driver element 12 is placed a sufficient distance A away from the negative surge protection diode 15.

FIG. 12 is a view exemplarily showing the plan structure of the semiconductor device which attains the equivalent circuit diagram in FIG. 11. This figure illustrates the negative surge absorbing unit 13.

Referring to FIG. 12, the semiconductor device has regions defined by the p-type isolation layer 24. Specifically, it is formed with a protection diode region 25 and a control circuit region 27 similar to those of the semiconductor device in FIG. 10.

That is to say, in this device, a negative surge protection diode 15 is formed which includes the p-type isolation layer 24, an n-type buried layer 28, and a heavily n-doped layer 29, and the heavily n-doped layer 29 is electrically connected to the connecting point N21 on an interconnect electrically connecting the input/output pad 11a to the control circuit 19.

Further, the driver element 12 surrounded with the p-type isolation region 24 is arranged a sufficient distance A away from the protection diode region 25.

In the device thus configured, if the driver element 12 has a negative potential to generate a surge, a parasitic NPN transistor may be activated which uses the n-type buried layer 28, the heavily n-doped layer 29, and the like as a collector, the p-type isolation region 24 and the like as a base, and an n-type epitaxial layer of the driver element 12 as an emitter. However, since the negative surge protection diode 15 and the driver element 12 are arranged sufficiently away from each other, the p-type isolation region corresponding to the base has a high resistance. This prevents activation of the parasitic NPN transistor. Owing to this, misoperation of the control circuit region 27 is avoided.

SUMMARY OF THE INVENTION

The conventional techniques described above, however, have the following problems.

The technique mentioned in Document 1 additionally requires a third island unrelated to any actual operation. That is to say, where the protection diode region 25 and the control circuit region 27 are defined as first and second island regions, respectively, the n-type peripheral region 26 as a third island region has to be formed between these two island regions necessary for actual operations.

Thus, the chip area increases by an amount corresponding to the third island region, which reduces the packing density of the semiconductor device.

The technique mentioned in Document 2 requires securing a sufficient distance A between the driver element 12 and the negative surge protection diode 15 connected to the input/output pad 11a. Thus, no element can be arranged around the driver element 12, so that a region with no element arranged therein is created. This may decrease the packing density of the semiconductor device.

Moreover, even though only the input/output pad 11a is arranged around the driver element 12, the wiring for connection therebetween becomes complicated, thereby increasing the area of the wiring on the chip. This results in an increase in the chip area, which in turn decreases the packing density of the semiconductor device.

Likewise, in the case where the output pad 11 or the input/output pad 11a has a positive potential (a positive surge is generated), the problems described above also arise in the positive surge absorbing unit 14 for protecting the driver element 12.

With the above problems in mind, an object of a semiconductor device of the present invention is to provide a stable semiconductor device having an input/output protection circuit capable of suppressing an increase in chip area and preventing the occurrence of misoperation.

To attain the above object, a semiconductor device of the present invention includes, above a semiconductor region of a first conductivity type, an output pad, a driver element connected to the output pad, and a surge absorption unit for protecting the driver element against a surge. The surge absorption unit includes: a semiconductor island region of a second conductivity type formed in or above the semiconductor region of the first conductivity type; a buried layer of the second conductivity type formed between the bottom of the semiconductor island region of the second conductivity type and the semiconductor region of the first conductivity type; a dopant layer of the first conductivity type formed in an upper portion of the semiconductor island region of the second conductivity type and electrically connected to have the same potential as the semiconductor region of the first conductivity type; a dopant layer of the second conductivity type formed in an upper portion of the dopant layer of the first conductivity type and electrically connected to the output pad; and a ring layer of the second conductivity type formed in the semiconductor island region of the second conductivity type to surround the dopant layer of the first conductivity type and to reach the buried layer of the second conductivity type. The ring layer of the second conductivity type is electrically connected to a terminal with a fixed potential and contains a dopant of the second conductivity type having a higher concentration than the semiconductor island region of the second conductivity type.

In the semiconductor device of the present invention, the dopant layer of the first conductivity type and the dopant layer of the second conductivity type constitute a protection diode.

In this device, at least the dopant layer of the first conductivity type, the dopant layer of the second conductivity type, and a region including the ring layer of the second conductivity type and the semiconductor island region of the second conductivity type constitute a protection transistor (a PNP transistor or an NPN transistor).

The protection diode and the protection transistor can protect the driver element if the potential of the output pad changes or a surge is applied from outside to the semiconductor device.

In such a case, an operating current mainly flows through the semiconductor island region of the second conductivity type and its inside and hardly flows through the semiconductor region of the first conductivity type. Therefore, operation of a parasitic thyristor formed in the semiconductor island region of the second conductivity type and its surrounding can be prevented to avoid misoperation such as latch-up.

Moreover, since surge absorption is made inside the semiconductor island region of the second conductivity type, no limitation is imposed on circuit arrangement in the periphery of the semiconductor island region of the second conductivity type. This increases the flexibility of circuit design and thereby accomplishes both prevention of misoperation such as latch-up and reduction of chip area.

In this device, the surge absorption unit may be a negative surge absorbing unit for protecting the driver element against a negative surge, the first conductivity type may be p-type and the second conductivity type may be n-type, and the fixed potential may be a potential equal to or higher than a ground potential. Hereinafter, such a case will be described in detail.

In the above case, the dopant layer of the first conductivity type is an anode layer, and the dopant layer of the second conductivity type is a cathode layer. The cathode and anode layers constitute a protection diode against a negative surge. In addition, the anode layer and the p-type semiconductor region can be set to have a ground potential.

Also, in the above case, an NPN transistor is formed which uses the cathode layer as an emitter, the anode layer as a base, and the n-type semiconductor island region and the n-type ring layer as a collector, and functions as an NPN protection transistor. That is to say, if, because of operation of a load connected to the output pad, the output pad has a negative potential or a negative surge (a negative surge voltage due to static electricity or the like) enters the semiconductor device, the NPN transistor is activated to absorb the negative surge, thereby protecting the driver element.

In this negative surge absorption, a large amount of an operating current flows through the n-type semiconductor island region connected to the fixed potential and its inside, and only a minimal amount of the operating current flows through the p-type semiconductor region. This prevents operation of a thyristor which is parasitically formed of semiconductor elements constituting the negative surge absorbing unit and a control circuit or the like arranged around the unit. That is to say, a latch-up phenomenon can be prevented to avoid misoperation of the semiconductor device resulting from the latch-up phenomenon. Consequently, damages of the misoperation to the semiconductor device can be prevented.

Moreover, the negative surge absorption is made inside the n-type semiconductor island region, and has no influence on the outside of the n-type semiconductor island region. Therefore, with the semiconductor device of the present invention, limitation on circuit arrangement in the periphery of the protection diode is eliminated. This increases the flexibility of circuit design and thereby accomplishes both prevention of misoperation such as latch-up and reduction of chip area.

Preferably, the fixed potential of the terminal to which the n-type ring layer is electrically connected is equal to a power supply potential.

This ensures prevention of a latch-up phenomenon. The reason for this is as follows.

If the output pad has a negative potential, the NPN protection transistor configured above is activated to pass a current from the n-type ring layer toward the n-type buried layer. At this time, the resistance of the n-type ring layer and the n-type buried layer drops a voltage therebetween. If this results in drop in the potential of the n-type buried layer or the like to the extent capable of producing a potential difference of a forward junction voltage or higher with respect to the p-type semiconductor region, the parasitically configured thyristor is activated to cause a latch-up phenomenon.

To avoid this problem, by electrically connecting the n-type ring layer to a terminal with a potential higher than the ground potential, drop in the potential of the n-type buried layer to such a value as to activate the thyristor by the voltage drop as mentioned above can be prevented. At this time, a power supply potential can be used as a potential higher than a ground potential to certainly provide the effect of preventing latch-up.

Preferably, the fixed potential is equal to a ground potential.

As a concrete example, the fixed potential of the terminal to which the n-type ring layer is electrically connected is preferably equal to a ground potential.

With this, a current supplied from the ground potential can absorb a negative surge to protect the driver element. Simultaneously with this, an increase in current consumption can be suppressed because, unlike the case where the n-type ring layer is connected to the power supply potential, the power supply potential is not involved in the occurrence of a current due to a parasitic operation.

Preferably, the semiconductor device of the present invention further includes a high-resistive layer which is formed to surround the perimeter of the dopant layer of the second conductivity type and cover the bottom thereof and which contains a dopant of the second conductivity type having a lower concentration than the dopant layer of the second conductivity type.

As a concrete example, preferably, the device further includes a high-resistive layer which is formed to surround the perimeter of the cathode layer and cover the bottom thereof and which contains an n-type dopant having a lower concentration than the cathode layer.

With this, the high-resistive layer has a lower dopant concentration than the cathode layer. Therefore, the concentration at the junction between the high-resistive layer and the anode layer is lower than that at the junction between the cathode layer and the anode layer which are directly connected. Thus, when the potential of the cathode layer rises, a depletion layer can be expanded more widely than the case where direct junction is made between the cathode layer and the anode layer. As a result, the reverse breakdown voltage of the protection diode can be increased.

As is apparent from the above, for the driver element with a higher guaranteed breakdown voltage, the function of the protection diode, that is, the function of the negative surge absorbing unit can be certainly exerted. Note that the guaranteed breakdown voltage is a maximum voltage capable of guaranteeing operation.

Furthermore, the dopant concentration of the high-resistive layer is low, which indicates that a high resistance is connected in series with the protection diode. Thus, a surge current flowing through the protection diode can be suppressed and thereby, in addition to the effects of preventing latch-up, the protection diode itself can be protected. Consequently, a comprehensive protection ability of the whole semiconductor device against a surge can be enhanced.

Preferably, the semiconductor device of the present invention further includes a buried layer of the first conductivity type which is provided between the bottom of the dopant layer of the second conductivity type and the buried layer of the second conductivity type and which contains a dopant of the first conductivity type having a higher concentration than the dopant layer of the first conductivity type.

As a concrete example, preferably, the device has a p-type buried layer provided between the bottom of the cathode layer and the n-type buried layer and containing a p-type dopant with a high concentration than the anode layer.

This suppresses the current gain of a vertical NPN transistor, so that a surge current flowing through the underlying p-type semiconductor region can be suppressed. Therefore, a latch-up phenomenon can be avoided more certainly. More detail description of this will be made below.

The p-type buried layer can be formed to increase the dopant concentration of the base area of the parasitic NPN transistor composed of the cathode layer, the anode layer, and the n-type buried layer. This reduces the current gain (hFE) of the parasitic NPN transistor and suppresses a current flowing therethrough, so that potential drop in the n-type buried layer can be suppressed.

As a result of this, operation of a parasitic thyristor having an NPNP structure formed by adding the p-type semiconductor region to the NPN transistor can be prevented to avoid a latch-up phenomenon more certainly.

Furthermore, since the concentration of the p-type dopant present between the n-type buried layer and the cathode layer is raised, the breakdown voltage against punch through between the n-type buried layer and the cathode layer can be increased. This increases the potentials of the n-type buried layer and the n-type semiconductor island region, which provides an increased design flexibility.

Preferably, the semiconductor device of the present invention further includes a plurality of contacts arranged in ring form over the entire surface of the ring layer of the second conductivity type, and the ring layer of the second conductivity type is electrically connected to the terminals with the fixed potential through the plurality of contacts.

As a concrete example, preferably, the device further includes a plurality of contacts arranged in ring form over the entire surface of the n-type ring layer, and the n-type ring layer is electrically connected to the terminals with the fixed potential through the plurality of contacts.

This makes the potentials of any portions of the n-type ring layer uniform. Thus, operation of a lateral transistor using the n-type ring layer as a collector can absorb a surge current in either direction to prevent a latch-up phenomenon.

Preferably, a resistance element is formed between the dopant layer of the second conductivity type and the output pad.

As a concrete example, preferably, a resistance element is formed between the cathode layer and the output pad.

With this, the resistance element is connected in series with the protection diode. Therefore, a surge current flowing through the protection diode can be suppressed. As a result of this, not only a control circuit formed in the periphery of the negative surge absorbing unit but also the protection diode itself can be protected. Consequently, a comprehensive protection ability of the whole semiconductor device against a surge can be enhanced.

In the semiconductor device of the present invention, the surge absorption unit may be a positive surge absorbing unit for protecting the driver element against a positive surge, and the first conductivity type may be n-type and the second conductivity type may be p-type.

With this, the semiconductor device can be protected against a positive surge while an increase in chip area is suppressed. This is implemented by a converse operation of the semiconductor device which is similar to the previously-described case where the first conductivity type is p-type and the second conductivity type is n-type and which, however, is opposite in current flowing direction to that case. Hereinafter, brief description will be made of the case where the first conductivity type is n-type and the second conductivity type is p-type.

To be more specific, in the above case, the dopant layer of the first conductivity type is a cathode layer, and the dopant layer of the second conductivity type is an anode layer. The cathode and anode layers constitute a protection diode against a positive surge. In addition, the cathode layer and the n-type semiconductor region can be set to have a power supply potential.

Also, in the above case, a PNP transistor is formed which uses the anode layer as an emitter, the cathode layer as a base, and the p-type semiconductor island region and the p-type ring layer as a collector, and operates as a PNP protection transistor for protecting the driver element against a positive surge.

In this operation, a large amount of an operating current flows through the p-type semiconductor island region connected to the fixed potential and its inside. This prevents operation of a thyristor which is parasitically formed in the semiconductor device, resulting in avoidance of misoperation of the device.

Moreover, the positive surge absorption is made inside the p-type semiconductor island region. Therefore, limitation on circuit arrangement in the periphery of the protection diode can be eliminated to reduce the chip area.

Preferably, the fixed potential of the terminal to which the p-type ring layer is electrically connected is equal to a power supply potential.

With this, in a similar way to that described previously, protection against a positive surge can be provided while an increase in power consumption is prevented.

Also, preferably, the fixed potential of the terminal to which the p-type ring layer is electrically connected is equal to a ground potential.

With this, in a similar way to that described previously, prevention of a latch-up phenomenon can be ensured.

Preferably, the semiconductor device further includes a high-resistive layer into which a p-type dopant with a lower concentration than the anode layer is introduced to surround the perimeter of the anode layer and cover the bottom thereof.

This increases the reverse breakdown voltage of the protection diode. Therefore, even for the driver element with a higher guaranteed breakdown voltage, the function of the positive surge absorbing unit can be certainly exerted.

Furthermore, provision of the high-resistive layer indicates that a high resistance is connected in series with the protection diode, so that the protection diode itself can be protected. Consequently, a comprehensive protection ability of the whole semiconductor device against a surge can be enhanced.

Also, preferably, an n-type buried layer containing an n-type dopant with a high concentration than the cathode layer is provided between the bottom of the anode layer and the p-type buried layer.

This suppresses the current gain of a vertical PNP transistor, so that a surge current flowing through the underlying n-type semiconductor region can be suppressed. Therefore, a latch-up phenomenon can be avoided more certainly.

Preferably, the semiconductor device further includes a plurality of contacts arranged in ring form over the entire surface of the p-type ring layer, and the p-type ring layer is electrically connected to the terminals with the fixed potential through the plurality of contacts.

Thus, operation of a lateral transistor using the p-type ring layer as a collector can absorb a surge current in either direction to prevent a latch-up phenomenon.

Preferably, a resistance element is formed between the anode layer and the output pad.

With this, the resistance element is connected in series with the protection diode. Therefore, a surge current flowing through the protection diode can be suppressed. As a result of this, not only a control circuit formed in the periphery of the positive surge absorbing unit but also the protection diode itself can be protected. Consequently, a comprehensive protection ability of the whole semiconductor device against a surge can be enhanced.

As described above, with the semiconductor device of the present invention, if a surge is applied to the output pad or the potential of the output pad changes, the surge absorption unit electrically connected to the connecting point positioned between the output pad and the driver element can protect the driver element against the surge.

In this device, the surge absorption unit includes the protection diode, the ring layer two-dimensionally surrounding the protection diode, and the buried layer formed below the protection diode. With this structure, operating current for absorbing a surge hardly flows through the semiconductor region underlying the buried layer.

As a result, operation of a parasitic thyristor formed of semiconductor elements constituting the surge absorption unit and a control circuit provided around the unit can be prevented. This avoids a latch-up phenomenon and misoperation of the semiconductor device.

Further, limitation on arrangement of a circuit such as a control circuit laid out in the periphery of the protection diode is eliminated. This provides a free circuit design and a reduced chip area.

As is apparent from the above, a stable semiconductor device can be provided at low cost.

DETAILED DESCRIPTION OF THE PREFERRED EMBODIMENTS (First Embodiment)

Hereinafter, a semiconductor device according to a first embodiment of the present invention will be described with reference to the accompanying drawings.

Figure 1:
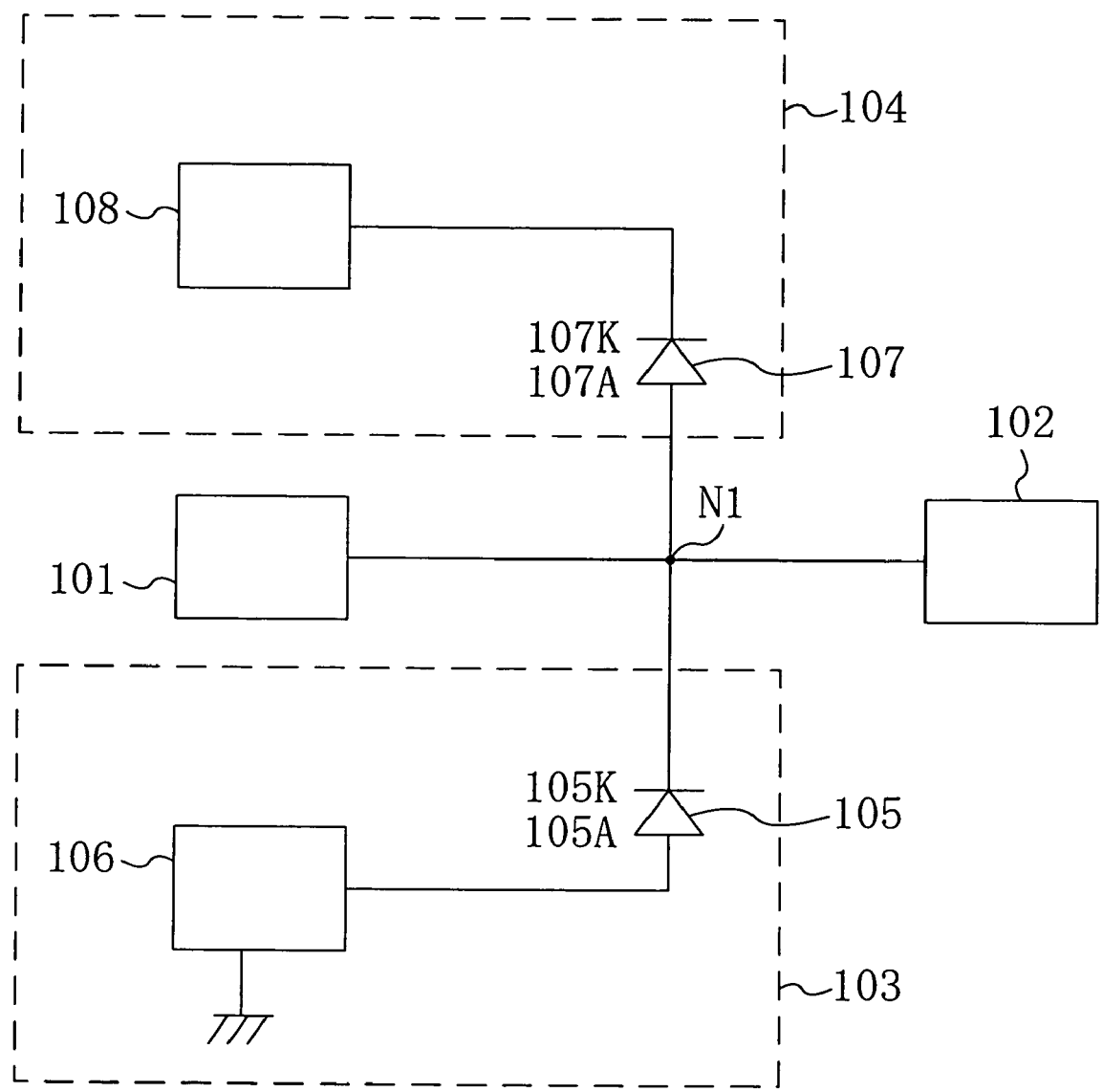
FIG. 1 is an equivalent circuit diagram of circuitry configured in a semiconductor device according to first, second, and third embodiments of the present invention.

FIG. 1 is an equivalent circuit diagram of circuitry configured in the semiconductor device according to the first embodiment. The semiconductor device includes an output pad 101 electrically connected to an inductive load (not shown), and a driver element 102 electrically connected to the output pad 101 and supplying a current. At a connecting point N1 positioned between the output pad 101 and the driver element 102, a negative surge absorbing unit 103 and a positive surge absorbing unit 104 are electrically connected to each other.

In this device, the negative surge absorbing unit 103 is provided with a negative surge protection diode 105 and a GND terminal 106. The negative surge protection diode 105 has a cathode 105K electrically connected to the connecting point N1 and an anode 105A electrically connected to the GND terminal 106. With such a configuration, if the output pad 101 has a negative potential to generate a surge, the negative surge protection diode 105 is activated to absorb the negative surge.

The positive surge absorbing unit 104 is provided with a positive surge protection diode 107 and a power supply terminal 108. The positive surge protection diode 107 has a cathode 107K electrically connected to the power supply terminal 108 and an anode 107A electrically connected to the connecting point N1. With such a configuration, if the output pad 101 has a positive potential to generate a surge, the positive surge protection diode 107 is activated to absorb the positive surge.

Figure 2:
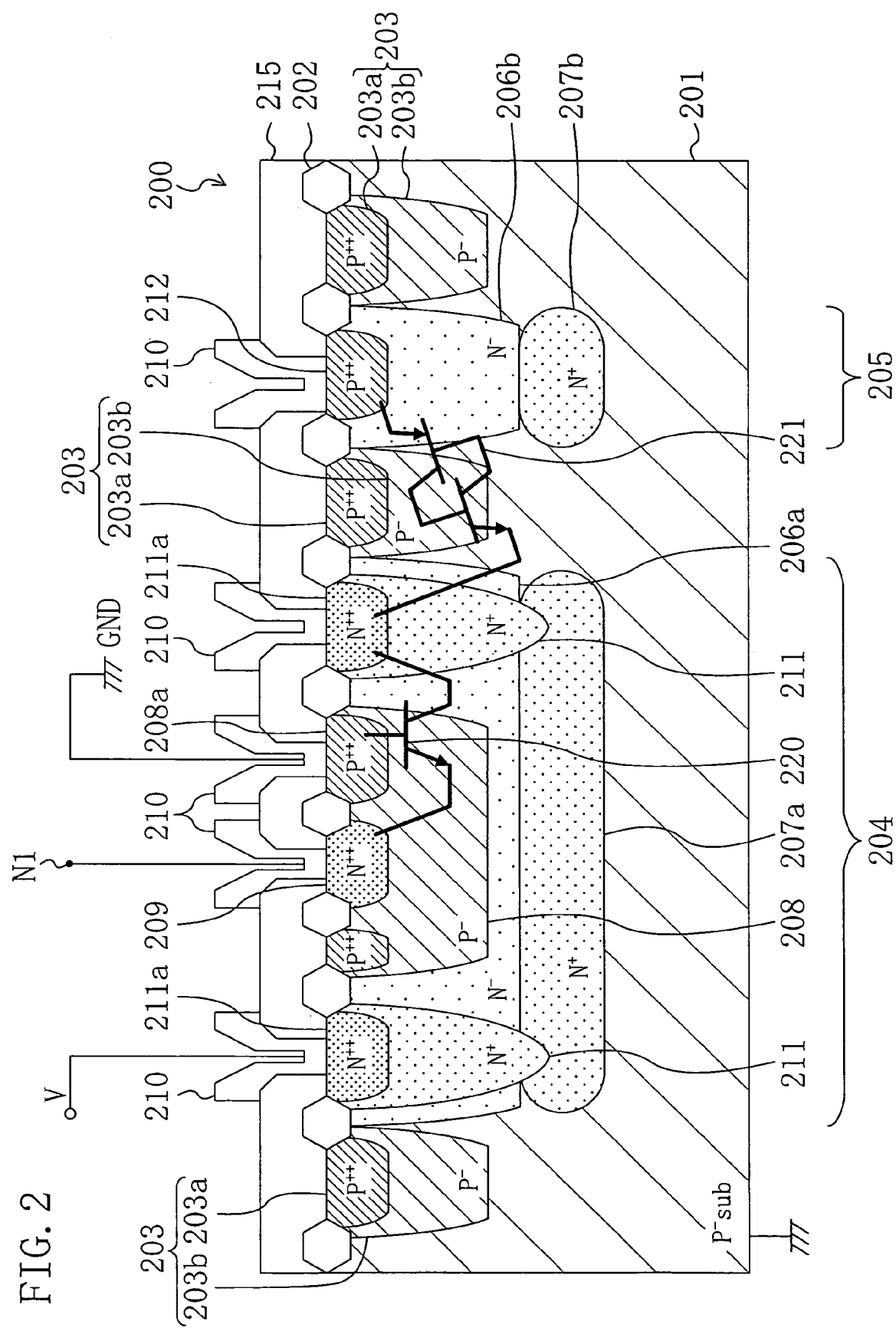
FIG. 2 is a view showing a cross section of a negative surge absorbing unit 103 and its periphery of a semiconductor device 200 according to the first embodiment of the present invention.
Figure 3:
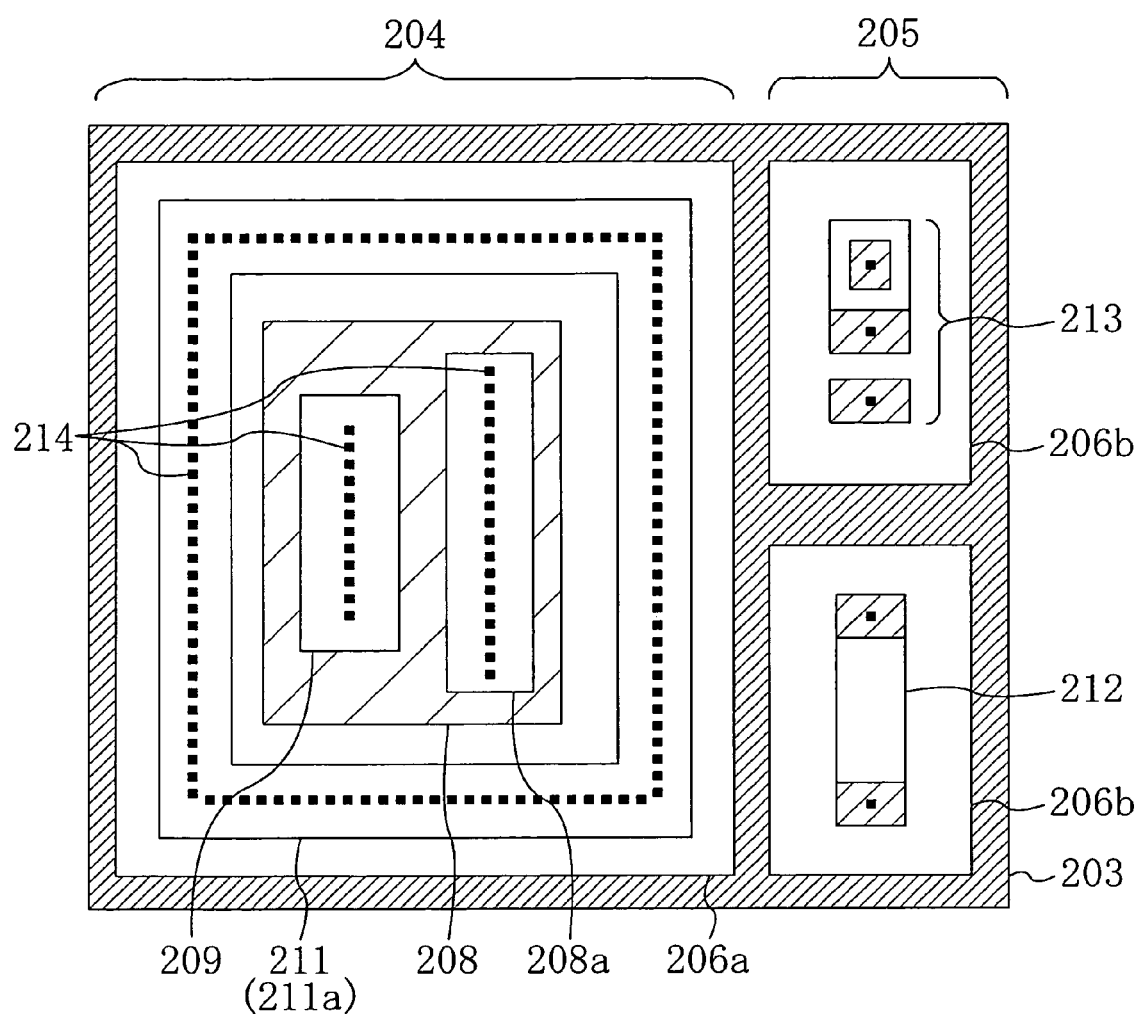
FIG. 3 is a view showing a plan configuration of the negative surge absorbing unit 103 and its periphery of the semiconductor device 200 according to the first, second, and third embodiments of the present invention.

Next, the structure of the negative surge absorbing unit 103 and its peripheral portion in the semiconductor device according to the first embodiment is shown in FIG. 2 as a sectional view and in FIG. 3 as a plan view. Note that in FIG. 3, several components (a LOCOS film 202, a metal electrode 210, an interlayer insulating film 215, and the like which will be described later) are omitted, and only the internal structure is shown. In the first embodiment, description will be made of the case where a first conductivity type is p-type and a second conductivity type is n-type.

In FIGS. 2 and 3, other components of the semiconductor device shown in FIG. 1, such as the output pad 101 and the driver element 102, are provided at locations in the device which are not shown in FIGS. 2 and 3.

In the semiconductor device 200 shown in FIGS. 2 and 3, a LOCOS film 202 and a p-type isolation layer 203 are formed on a p-type semiconductor substrate 201 as a p-type semiconductor region. The p-type semiconductor substrate 201 is divided into multiple regions, specifically, into a protection diode region 204, a control circuit region 205, and the like (the control circuit region 205 may be further divided into multiple areas as shown in FIG. 3).

In this structure, the p-type isolation layer 203 is composed of a heavily p-doped layer 203a (into which a p-type dopant is introduced at a concentration of, for example, $1\times10^{20}/cm^3$) formed in and below the surface of the p-type semiconductor substrate 201 and a p-type upper isolation layer 203b (into which a p-type dopant is introduced at a concentration of, for example, $5\times10^{16}/cm^3$) formed below the heavily p-doped layer 203a. However, the heavily p-doped layer 203a provided in the surface is formed to reduce an apparent resistive component of the p-type semiconductor substrate 201 or to perform a function of a channel stopper, and thus it is not an essential component as an isolation layer.

The LOCOS film 202 is used as a field oxide film. Openings of the LOCOS film 202 are used to introduce dopants into the p-type semiconductor substrate 201.

As an n-type semiconductor island region formed on the p-type semiconductor substrate 201, a first n-well 206a is formed in the protection diode region 204. Likewise, a second n-well 206b is formed in the control circuit region 205 (both the first and second n-wells have an n-type dopant concentration of, for example, $2\times10^{15}/cm^3$). Further, a first n-type buried layer 207a and a second n-type buried layer 207b (both of which have an n-type dopant introduced at a concentration of, for example, $2\times10^{18}/cm^3$) are formed between the bottoms of the first and second n-wells 206a and 206b and the p-type semiconductor substrate 201, respectively.

A p-type dopant is introduced into the vicinity of the surface of the first n-well 206a at a low concentration (for example, $5\times10^{16}/cm^3$), thereby forming an anode layer 208. Further, a p-type dopant is introduced into the vicinity of the surface of the anode layer 208 at a higher concentration than that of the anode layer 208 (for example, $1\times10^{20}/cm^3$), thereby forming an anode contact layer 208a.

An n-type dopant with a high concentration (for example, $1\times10^{20}/cm^3$) is introduced into a location in the surface of the anode layer 208 which does not overlap the anode contact layer 208a, thereby forming a cathode layer 209.

Note that the negative surge protection diode 105 shown in FIG. 1 is formed which uses the anode layer 208 and the anode contact layer 208a in FIG. 2 as the anode 105A, and the cathode layer 209 in FIG. 2 as the cathode 105K.

Metal electrodes 210 are formed to make connections to the anode contact layer 208a and the cathode layer 209, respectively. With these connections, the anode contact layer 208a is electrically connected to a GND potential terminal having the same potential as the p-type semiconductor substrate 201, and the cathode layer 209 is electrically connected to the connecting point N1 as shown in FIG. 1.

Around the anode layer 208, an n-type ring layer 211 is formed which has a plan shape surrounding the anode layer 208 and extends from the surface of the first n-well 206a to the first n-type buried layer 207a. It is formed by introducing an n-type dopant into the first n-well 206a at a higher concentration than that of the first n-well 206a (for example, $1\times10^{19}/cm^3$).

An n-type dopant is introduced into the vicinity of the surface of the n-type ring layer 211 at a higher concentration than that of the n-type ring layer 211 (for example, $1\times10^{20}/cm^3$), thereby forming an n-type contact layer 211a. The metal electrode 210 is formed to make connection to the n-type contact layer 211a, and through the formed metal electrode 210, the n-type ring layer 211 is electrically connected to a terminal with a fixed potential V of a predetermined value.

The control circuit region 205 is formed with required types of semiconductor elements. In FIG. 2, as an exemplary semiconductor element, a p-type resistive layer 212 (into which a p-type dopant is introduced at a concentration of, for example, $1\times10^{18}/cm^3$) formed in the surface of the second n-well 206b is shown. In FIG. 3, not only the p-type resistive layer 212 but also a transistor 213 is formed.

As shown in FIG. 3, contacts 214 for securing electrical connections are aligned on the n-type ring layer 211, the anode contact layer 208a, and the cathode layer 209.

An interlayer insulating film 215 (omitted in FIG. 3) is formed which has openings at predetermined positions and covers the p-type semiconductor substrate 201.

Note that the connecting point N1, the GND potential terminal, and the fixed potential terminal V are also shown in FIG. 2. However, these components are shown simply for the purpose of illustrating the presence of electrical connections to these components formed in positions in the semiconductor device 200 not shown in FIG. 2, and the structure in this figure having these components is not an actual structure of the device.

In the semiconductor device 200 thus constructed, the negative surge protection diode 105, which is formed so that the anode layer 208 and the anode contact layer 208a are used as an anode and that the cathode layer 209 is used as a cathode, is surrounded with the n-type ring layer 211 which reaches the first n-type buried layer 207a. The lower portion of the negative surge protection diode 105 is also surrounded with the first n-type buried layer 207a. As a consequence of this, the negative surge protection diode 105 is fully surrounded with the n-type layers.

Next description will be made of operations of the semiconductor device according to the first embodiment, which has the structure described above.

In the semiconductor device 200, a parasitic NPN transistor 220 is formed. To be more specific, the parasitic NPN transistor 220 is composed of the cathode layer 209 as an emitter, the anode layer 208 and the anode contact layer 208a as a base, and the first n-well 206a, the n-type ring layer 211, the n-type contact layer 211a, and the n-type buried layer 207a as a collector.

In the semiconductor device 200, a parasitic thyristor 221 with a PNPN structure is also formed. To be more specific, the parasitic thyristor 221 is composed of the p-type resistive layer 212 as an anode area, the second n-well 206b, the p-type isolation 203 and the p-type semiconductor substrate 201 as a gate area, and the first n-well 206a, the n-type ring layer 211, the n-type contact layer 211a, and the n-type buried layer 207a as a cathode area.

If the output pad 101 in FIG. 1 connected to the inductive load has a negative potential, the parasitic NPN transistor 220 is activated in the semiconductor device 200 to supply a current from the fixed potential terminal V. This enables protection of the driver element 102.

At this time, the gate area (such as the p-type isolation 203) and the cathode area (such as the n-type ring layer 211) of the parasitic thyristor 221 have the same potential or are reverse biased. Therefore, the parasitic thyristor 221 cannot be activated. This results from the fact that since the n-type contact layer 211a is electrically connected to the fixed potential terminal V with a ground potential or higher, the cathode area of the parasitic thyristor 221 has a certain potential of the ground potential or higher, and the fact that the p-type isolation layer 203 has the ground potential equal to that of the p-type semiconductor substrate 201.

As described above, by the operation of the parasitic NPN transistor 220, the driver element 102 can be protected in the protection diode region 204. Simultaneously, since the parasitic thyristor 221 is not activated, misoperation (such as latch-up) of the control circuit region 205 and the like can be prevented.

Furthermore, the negative surge protection diode 105 in the first embodiment is formed within a single n-type semiconductor island region (the first n-well 206a) surrounded with the p-type isolation layer 203, which suppresses an increase in required element area. Moreover, there is no constraint on circuits formed around the protection diode region 204, which improves the flexibility of circuit design in the device. This also suppresses an increase in chip area.

Thus, with the semiconductor device of the first embodiment, an increase in chip area can be suppressed and the occurrence of misoperation can be prevented.

Herein, assumption will be made of the case where the fixed potential terminal V to which the n-type contact layer 211a is electrically connected has a ground potential or higher.

If the output pad 101 has a negative potential, the parasitic NPN transistor 220 is activated to pass a current from the n-type ring layer 211 toward the n-type buried layer 207a. At this time, resistances of the n-type ring layer 211 and the n-type buried layer 207a cause voltage drop. This may result in the situation in which the potential of the n-type buried layer 207a drops to the extent capable of producing a potential difference equal to or more than the forward junction voltage between the p-type semiconductor substrate 201 and the n-type buried layer 207a. In such a situation, the gate area (such as the p-type isolation 203) and the cathode area (such as the n-type ring layer 211) of the parasitic thyristor 221 are forward biased to activate the parasitic thyristor 221. This would cause misoperation.

However, in the case where the fixed potential terminal V has a ground potential or higher, even after a current flows through the n-type ring layer 211 and the n-type buried layer 207a to cause voltage drop, the resulting potential of the n-type buried layer 207a can be about a value capable of preventing activation of the parasitic thyristor 221. As a result, misoperation such as latch-up of the control circuit region 205 and the like can be certainly prevented. For example, the n-type contact layer 211a is electrically connected to a power supply potential terminal to set the fixed potential V at a power supply potential. This easily produces the fixed potential V higher than the ground potential.

Next, assumption will be made of the case where the fixed potential terminal V has a ground potential.

In the case where the fixed potential terminal V has a ground potential or higher, for example, the power supply voltage VCC, a current is supplied from the power supply terminal of the semiconductor device, and a resulting parasitic operation passes a current from the n-type ring layer 211 toward the n-type buried layer 207a. This results in an increase in current consumption of the semiconductor device.

In contrast to this, in the case where the fixed potential terminal V has a ground potential, a current is supplied from a ground potential, so that no current by the parasitic operation flows from the power supply terminal of the semiconductor device. As a result of this, not only latch-up or the like can be prevented to some extent, but also an increase in current consumption of the semiconductor device can be prevented. The case where the fixed potential terminal V has a ground potential has such an advantage.

Furthermore, as shown in FIG. 3, in the semiconductor device 200 of the first embodiment, the contacts 214 formed on the n-type ring layer 211 are arranged in ring form over the entire surface on the n-type ring layer 211. With this arrangement, a uniform potential independent of the position in the plane is produced in the n-type ring layer 211. As a result, the parasitic NPN transistor 220, which uses the area including the n-type ring layer 211 as a collector, can perform uniform operations in either direction. Moreover, an excessive surge current can be absorbed by the device.

From the above, by arranging the contacts in ring form over the entire surface on the n-type ring layer 211, the effect of preventing misoperation of the circuit can be certainly attained.

In fabricating the semiconductor device 200, the anode layer 208 and the p-type upper isolation layer 203b can be simultaneously formed in the same step and as, for example, doped layers. Likewise, the cathode layer 209 and the n-type contact layer 211a can be formed as diffused layers of the same type or the like. Still likewise, the anode contact layer 208a and the heavily p-doped layer 203a can be formed as diffused layers of the same type or the like.

In the case where an NMOSFET (Metal Oxide Semiconductor Field Effect Transistor) is fabricated in the semiconductor device 200, the anode layer 208, the p-type upper isolation layer 203b, and a p-type well for forming the NMOSFET (n-channel MOSFET) can be formed as diffused layers of the same type.

As is apparent from the above, with the structure of the protection diode region 204 in the first embodiment, the necessity to add a new step to the conventional semiconductor device fabrication process can be eliminated and an increase in fabrication costs can be reduced.

The buried layer such as the first n-type buried layer 207a in this device can be formed by introducing ions by high energy implantation with a high energy level. In this introduction, the depth at which the ions are introduced (the depth at which the buried layer is positioned) can be controlled by adjusting the energy level.

The p-type isolation layer 203 is not one of the essential components in the first embodiment, so that it can be omitted. In this case, the n-wells formed on the p-type substrate 201 function as island regions, respectively. This eliminates costs for forming the p-type isolation layer 203, so that fabrication costs of the semiconductor device 200 can be reduced.

(Second Embodiment)

Next, a semiconductor device according to a second embodiment of the present invention will be described with reference to the accompanying drawings.

Also in the second embodiment, circuitry corresponding to the equivalent circuit diagram shown in FIG. 1 is configured. The second embodiment differs from the first embodiment in the structure of the negative surge absorbing unit 104. Hence, this difference will be described in detail.

Figure 4:
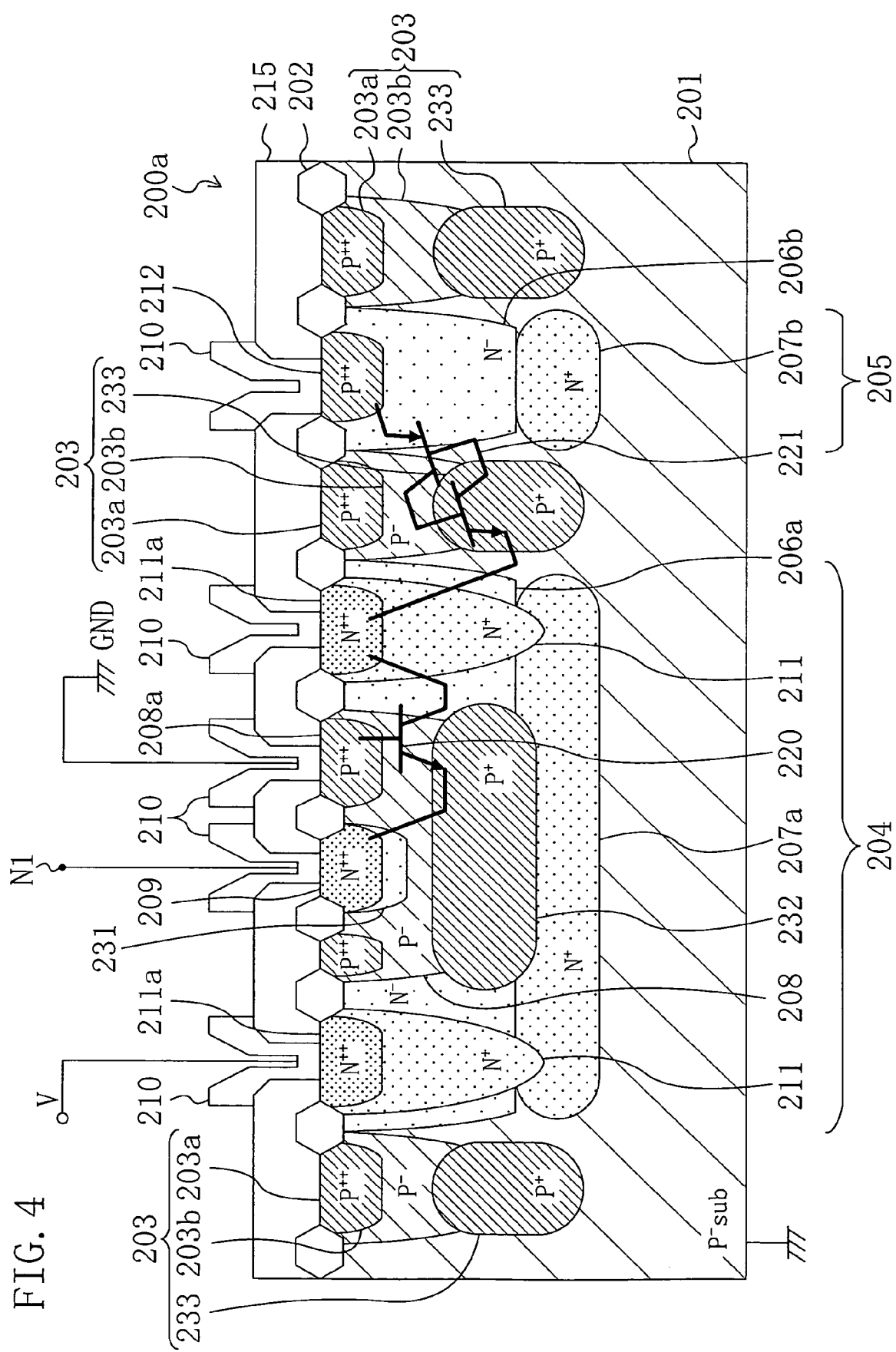
FIG. 4 is a view showing a cross section of a negative surge absorbing unit 103 and its periphery of a semiconductor device 200a according to the second embodiment of the present invention.

FIG. 4 is a view showing a cross section of a semiconductor device 200a according to the second embodiment. The illustrated semiconductor device 200a has the structure in which several components are added to the semiconductor device 200 of the first embodiment shown in the sectional view of FIG. 2. Thus, description of the components of the semiconductor device 200a shown in FIG. 4 that are the same as those of the semiconductor device 200 shown in FIG. 2 will be omitted by retaining the same reference numerals, and the difference between the two devices will be mainly described in detail.

Note that the plane structure of the semiconductor device 200a is similar to that shown in FIG. 3.

First, in the semiconductor device 200a shown in FIG. 4, in addition to the structure of the semiconductor device 200 in FIG. 2, an n-type high-resistive layer 231 is formed which is shaped to two-dimensionally surround the circumference of the cathode layer 209 and also to surround the bottom thereof. The n-type high-resistive layer 231 is formed by introducing an n-type dopant at a low concentration (for example, $2 \times 10^{17}/cm^3$).

The n-type high-resistive layer 231 thus formed has a low dopant concentration than the cathode layer 209, so that the junction thereof with the anode layer 208 has a low concentration. Therefore, when the potential of the cathode rises, a depletion layer can be expanded more widely than when direct junction is made between the anode layer 208 and the cathode layer 209. As a result, formation of the n-type high-resistive layer 231 improves the reverse breakdown voltage of the protection diode 105. Consequently, even for the driver element 102 with a higher guaranteed breakdown voltage, the diode can exert protection ability.

In addition, the n-type high-resistive layer 231 has a low dopant concentration, so that it has a high resistance. This indicates that a high resistance is connected in series with the protection diode 105, which suppresses a surge current flowing through the protection diode 105. As a consequence of this, not only a control circuit and the like formed around the protection diode region 204 but also the protection diode 105 itself can be protected. Therefore, the resistance ability of the semiconductor device 200a to a surge can be comprehensively enhanced.

Note that the resistance ability of the protection diode 105 to a surge deteriorates as the area of its plan shape becomes small. Thus, in the case where the protection diode 105 with the plan shape of a small area is formed, that is, where the cathode layer 209 or the like has a plan shape of a small area, the effect of forming the n-type high-resistive layer 231 is exerted prominently.

The semiconductor device 200a in FIG. 4 has, in addition to the structure of the semiconductor device 200 in FIG. 2, a p-type buried layer 232 formed between the bottom of the cathode layer 209 and the first n-type buried layer 207a. The p-type buried layer 232 is formed by introducing a p-type dopant of a predetermined concentration (for example, $2 \times 10^{17}/cm^3$) into the location to be formed with the layer.

In the semiconductor device 200 in FIG. 2, the cathode layer 209, the anode layer 208, and the first n-type buried layer 207a constitute a vertical parasitic NPN transistor. In contrast to this, in the semiconductor device 200a in FIG. 4, formation of the p-type buried layer 232 raises the concentration of the base area of the parasitic NPN transistor.

This reduces the current gain (hFE) of the parasitic NPN transistor and thereby suppresses a current flowing therethrough. Therefore, potential drop of the first n-type buried layer 207a can be suppressed.

That is to say, provision of the p-type buried layer 232 can suppress potential drop of the first n-type buried layer 207a, and thereby sufficiently suppress operation of the parasitic thyristor (NPNP structure) formed by adding the p-type semiconductor substrate 201 to the parasitic NPN transistor. This avoids a latch-up phenomenon more certainly.

Moreover, since the concentration of the p-type dopant present between the first n-type buried layer 207a and the cathode layer 209 is raised, the resistance to punch through occurring between the first n-type buried layer 207a and the cathode layer 209 can be enhanced. This increases the potential of the first n-type buried layer 207a and in addition the potential of the n-type ring layer 211, which provides an increased design flexibility. The semiconductor device 200a in FIG. 4 has, in addition to the structure of the semiconductor device 200 in FIG. 2, a p-type lower isolation layer 233 formed below the p-type upper isolation layer 203. The p-type lower isolation layer 233 is a layer into which a p-type dopant is introduced at a high concentration (for example, $2 \times 10^{17}/cm^3$). Thus, the p-type isolation layer 203 of the semiconductor device 200a is composed of the heavily p-doped layer 203a, the p-type upper isolation layer 203b, and the p-type lower isolation layer 233.

The p-type isolation layer 203 can also have the structure described above.

Note that in fabricating the semiconductor device 200a, the p-type buried layer 232 and the p-type lower isolation layer 233 can be simultaneously formed in the same step and as doped layers or the like.

If a PMOSFET (p-channel MOSFET) is formed in the semiconductor device 200a, the n-type high-resistive layer 231 can be formed simultaneously with an n-type well for forming the PMOSFET and as a diffused layer or the like of the same type as the n-type well.

Thus, in the case where in the semiconductor device 200a of the second embodiment, a CMOSFET (Complementary MOSFET) is used as the driver element 102 and a control element, any of the n-type high-resistive layer 231, the p-type buried layer 232, and the p-type lower isolation layer 233 provided in addition to the semiconductor device 200 of the first embodiment can be formed while the need to add new formation steps of them is avoided.

As described above, the semiconductor device of the second embodiment can exert the effects identical to those of the semiconductor device of the first embodiment more prominently.

(Third Embodiment)

Next, a semiconductor device according to a third embodiment of the present invention will be described with reference to the accompanying drawings.

Also in the third embodiment, circuitry corresponding to the equivalent circuit diagram shown in FIG. 1 is configured. The third embodiment differs from the first and second embodiments in the structure of the negative surge absorbing unit 104. Hence, this difference will be described in detail.

Figure 5:
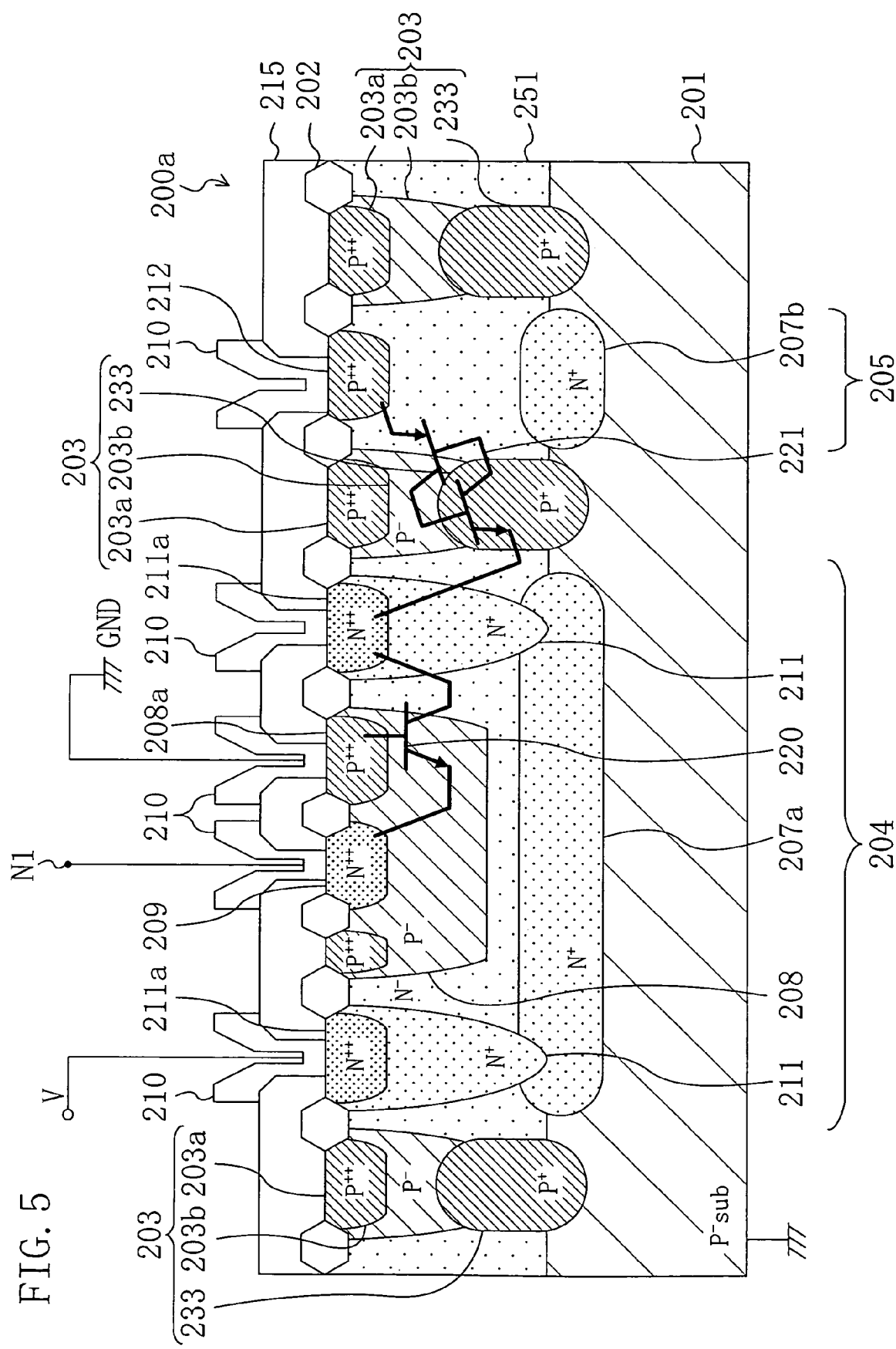
FIG. 5 is a view showing a cross section of a negative surge absorbing unit 103 and its periphery of a semiconductor device 200a according to the third embodiment of the present invention.

FIG. 5 is a sectional view of a semiconductor device 200a according to the third embodiment. The semiconductor device 200a contains the structure in common with the semiconductor device 200 of the first embodiment, so that in the third embodiment, the difference between the semiconductor devices 200a and 200 will be mainly described.

Note that the plane structure of the semiconductor device 200a is similar to that shown in FIG. 3.

In the semiconductor device 200 of the first embodiment, the n-wells (including the first n-well 206a and the second n-well 206b) are provided in the p-type semiconductor substrate 201 to form n-type semiconductor island regions. In contrast to this, in semiconductor device 200a of the third embodiment, an n-type epitaxial layer 251 is formed on the p-type semiconductor substrate 201 serving as a p-type semiconductor region and the formed n-type epitaxial layer 251 is divided by the p-type isolation layer 203 to form p/n-type semiconductor island regions. To be more specific, similarly to the first embodiment, the protection diode region 204, the control circuit region 205, and the like are defined in the n-type epitaxial layer 251. Note that the n-type epitaxial layer 251 contains an n-type dopant at a concentration of, for example, $2 \times 10^{15}/cm^3$.

In this device, the p-type isolation layer 203 has a three-layer structure as in the case of the second embodiment. Specifically, the p-type isolation layer 203 is composed of the heavily p-doped layer 203a, the p-type upper isolation layer 203b, and the p-type lower isolation layer 233. The p-type isolation layer 203 is formed to reach the p-type semiconductor substrate 201.

Other than the points described above, the semiconductor device 200a of the third embodiment has the same structure as the semiconductor device 200 of the first embodiment. Therefore, detail description of the components in FIG. 5 that are in common with those in FIG. 2 will be omitted by retaining the same reference numerals.

The semiconductor device 200a having the structure mentioned above can suppress an increase in chip area and concurrently prevent the occurrence of misoperation as in the case of the semiconductor device 200.

That is to say, if the output pad 101 has a negative potential, the parasitic NPN transistor 220 is activated in the semiconductor device 200a to supply a current from the fixed potential terminal V. Thereby, the driver element 102 can be protected. Simultaneously with this, operation of the parasitic thyristor 221 can be prevented, so that misoperation such as latch-up can be avoided. Moreover, since the negative surge protection diode 105 is formed within a single n-type semiconductor island region surrounded with the p-type isolation layer 203, an increase in a required element area can be suppressed.

As described above, with the semiconductor device of the third embodiment, an increase in chip area can be suppressed and the occurrence of misoperation can be prevented.

Note that the parasitic NPN transistor 220 is concretely composed of the cathode layer 209 as an emitter, the anode layer 208 and the anode contact layer 208a as a base, and the n-type epitaxial layer 251, the n-type ring layer 211, the n-type contact layer 211a, and the n-type buried layer 207a as a collector.

The parasitic thyristor 221 is concretely composed of the p-type resistive layer 212 as an anode area, the n-type epitaxial layer 251, the p-type isolation 203 and the p-type semiconductor substrate 201 as a gate area, and the n-type epitaxial layer 251, the n-type ring layer 211, the n-type contact layer 211a, and the n-type buried layer 207a as a cathode area.

In the third embodiment, the first n-type buried layer 207a, the second n-type buried layer 207b, the p-type lower isolation layer 233, and the p-type buried layer 232 may be formed, before growth of the n-type epitaxial layer 201, by predetermined methods.

Figure 6:
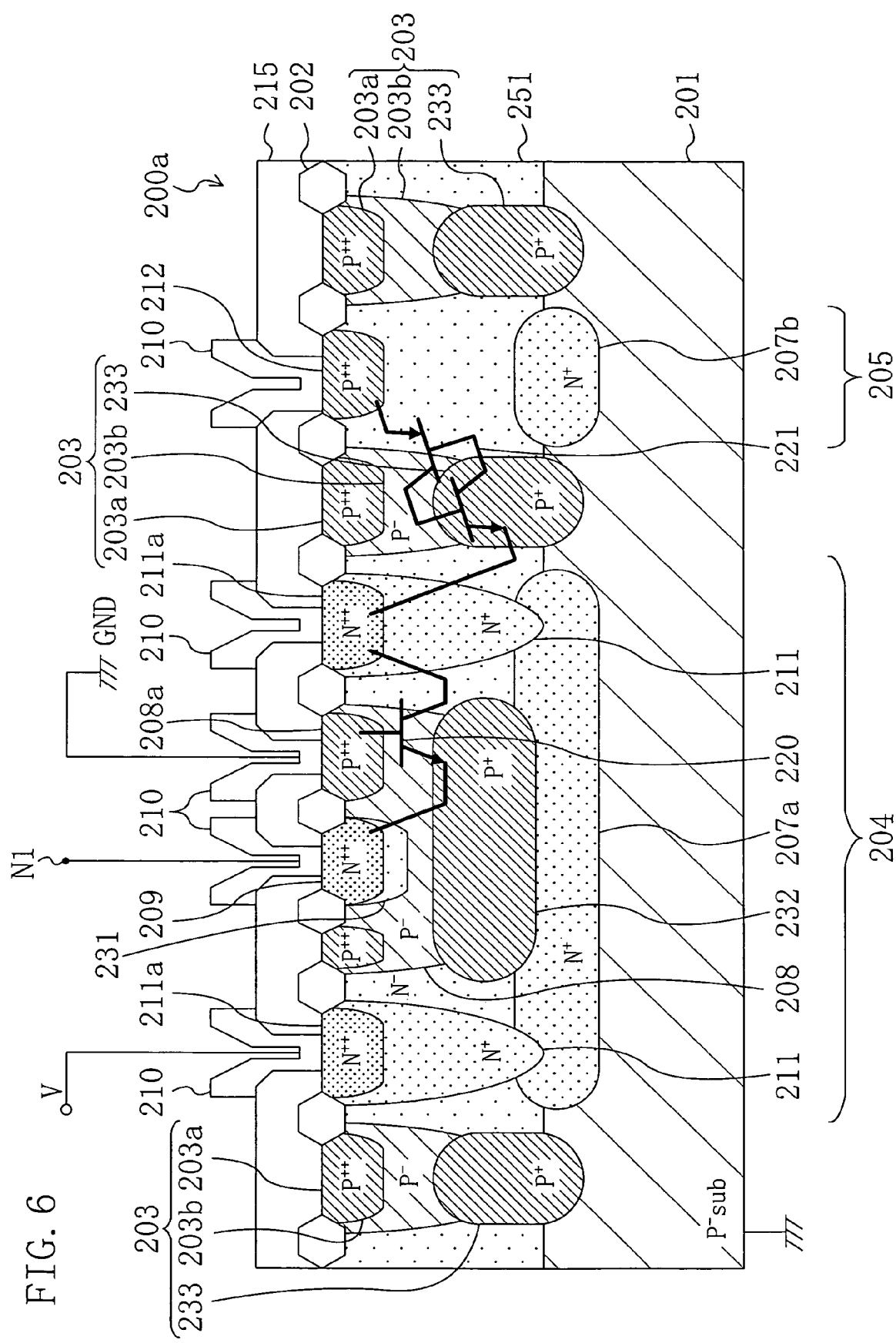
FIG. 6 is a view showing a cross section of the negative surge absorbing unit 103 and its periphery of the semiconductor device 200a according to the third embodiment of the present invention in the case where a p-type buried layer 232 and an n-type high-resistive layer 231 are also formed in the unit.

Similarly to the semiconductor device 200a of the second embodiment, the semiconductor device 200a of the third embodiment may also have the n-type high-resistive layer 231 and the p-type buried layer 232. Such a structure is shown in FIG. 6.

If the n-type high-resistive layer 231 is formed which is shaped to surround to two-dimensionally surround the circumference of the cathode layer 209 and also to surround the bottom thereof, the device can exert protection ability like the second embodiment even for the driver element 102 with a higher guaranteed breakdown voltage. Moreover, the resistance ability of the semiconductor device 200a to a surge can be comprehensively enhanced.

If the p-type buried layer 232 is formed between the bottom of the cathode layer 209 and the first n-type buried layer 207a, a latch-up phenomenon can be prevented more certainly like the second embodiment.

In the first to third embodiments described above, description has been made of the case where the first conductivity type is p-type, the second conductivity type is n-type, and the surge absorption unit is the negative surge absorbing unit 103 (see FIG. 1).

However, contrary to this, also in the case where the first conductivity type is n-type, the second conductivity type is p-type, and the surge absorption unit is the positive surge absorbing unit 104, the present invention can be used. In this case, an n-type semiconductor substrate and the like corresponding to a semiconductor region of the first conductivity type and a cathode contact layer corresponding to a dopant layer of the first conductivity type can be electrically connected to a power supply voltage.

Such a structure causes a converse operation opposite to the previously-described cases in current flowing direction. This operation can absorb a positive surge and prevent misoperation such as latch-up. In the device with this structure, an increase in chip area is suppressed.

(Fourth Embodiment)

Next, a fourth embodiment of the present invention will be described with reference to the accompanying drawings.

Figure 7:
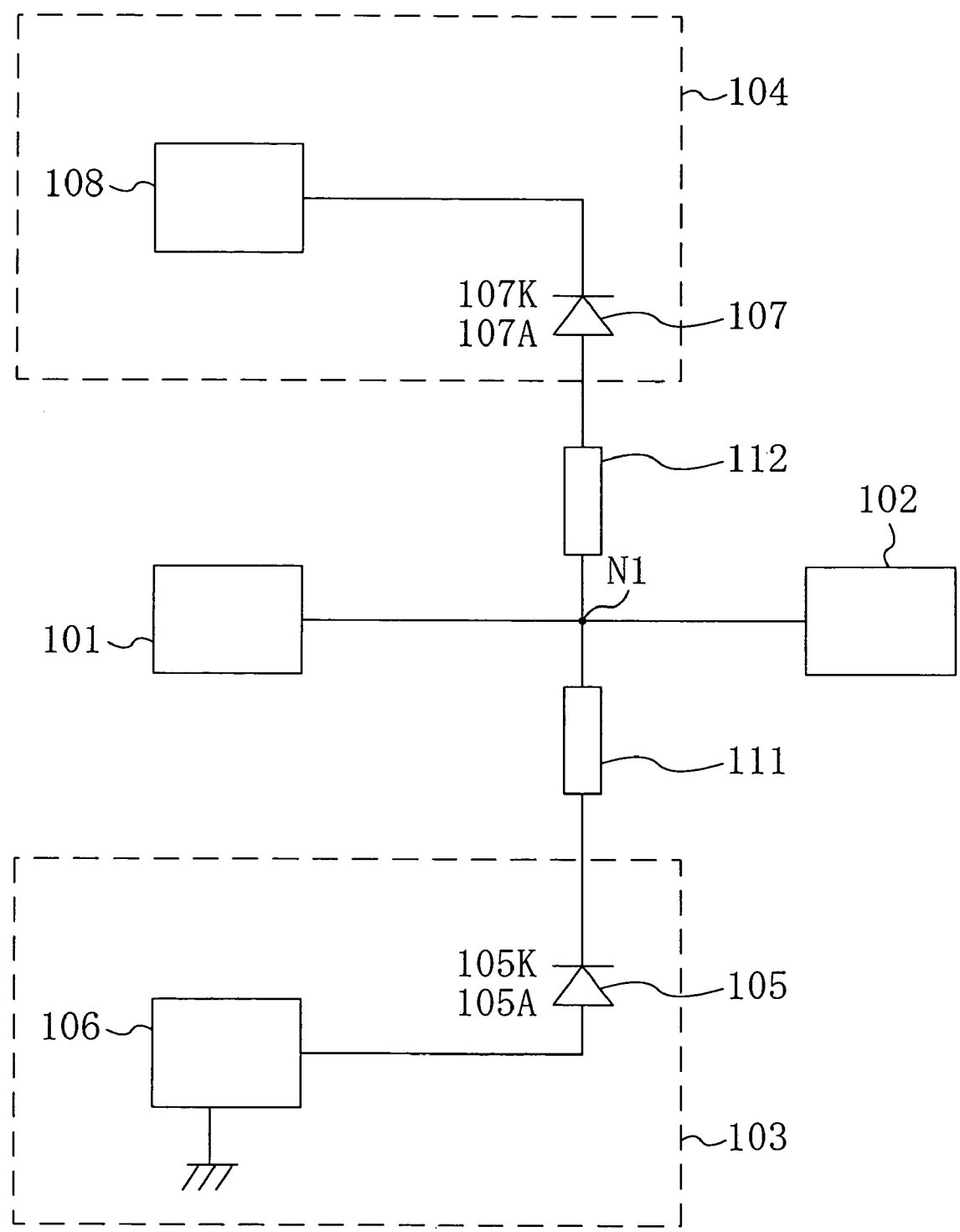
FIG. 7 is an equivalent circuit diagram of circuitry configured in a semiconductor device according to a fourth embodiment of the present invention.
Figure 8:
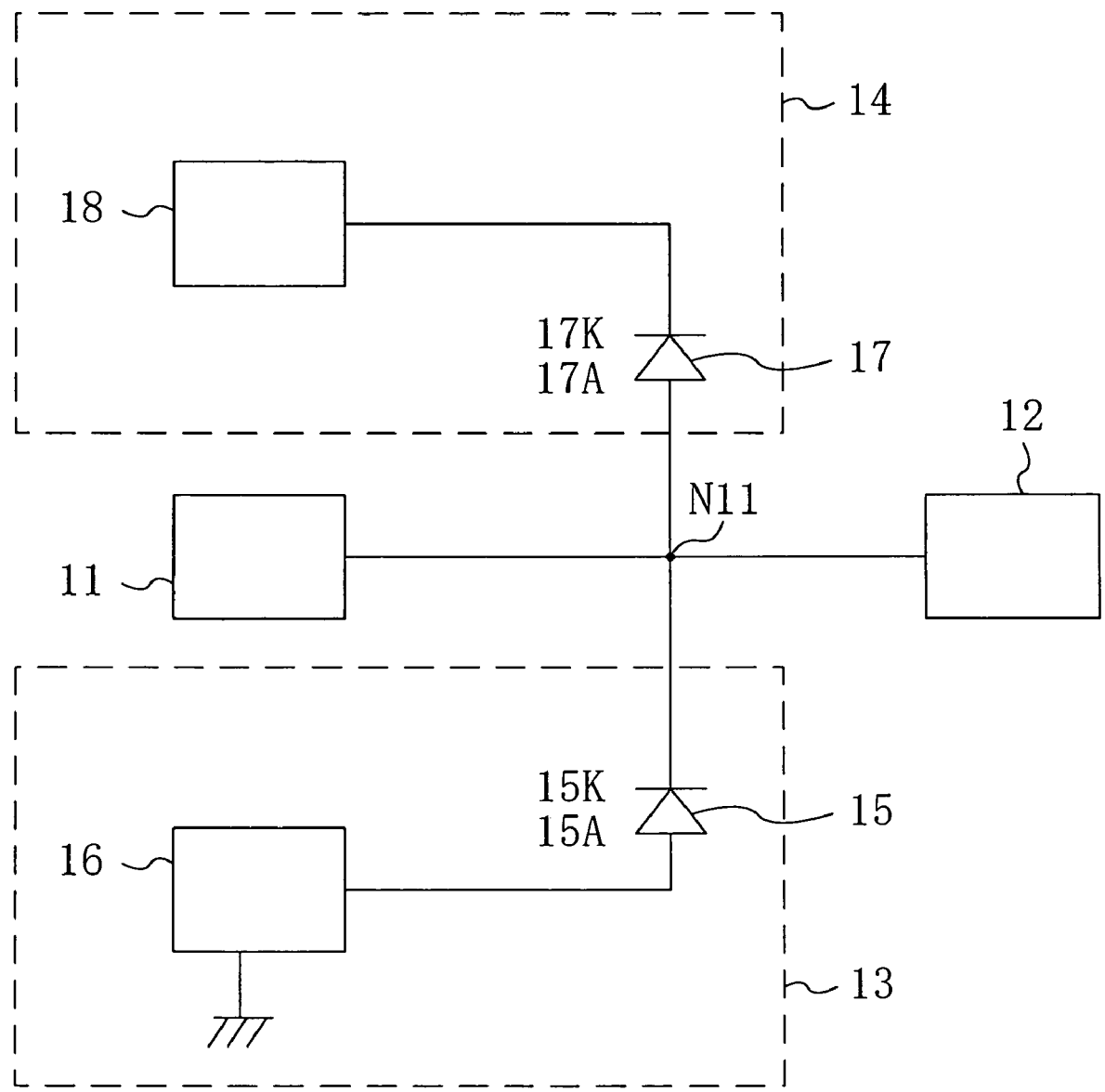
FIG. 8 is an equivalent circuit diagram of circuitry configured in a conventional semiconductor device.
Figure 9:
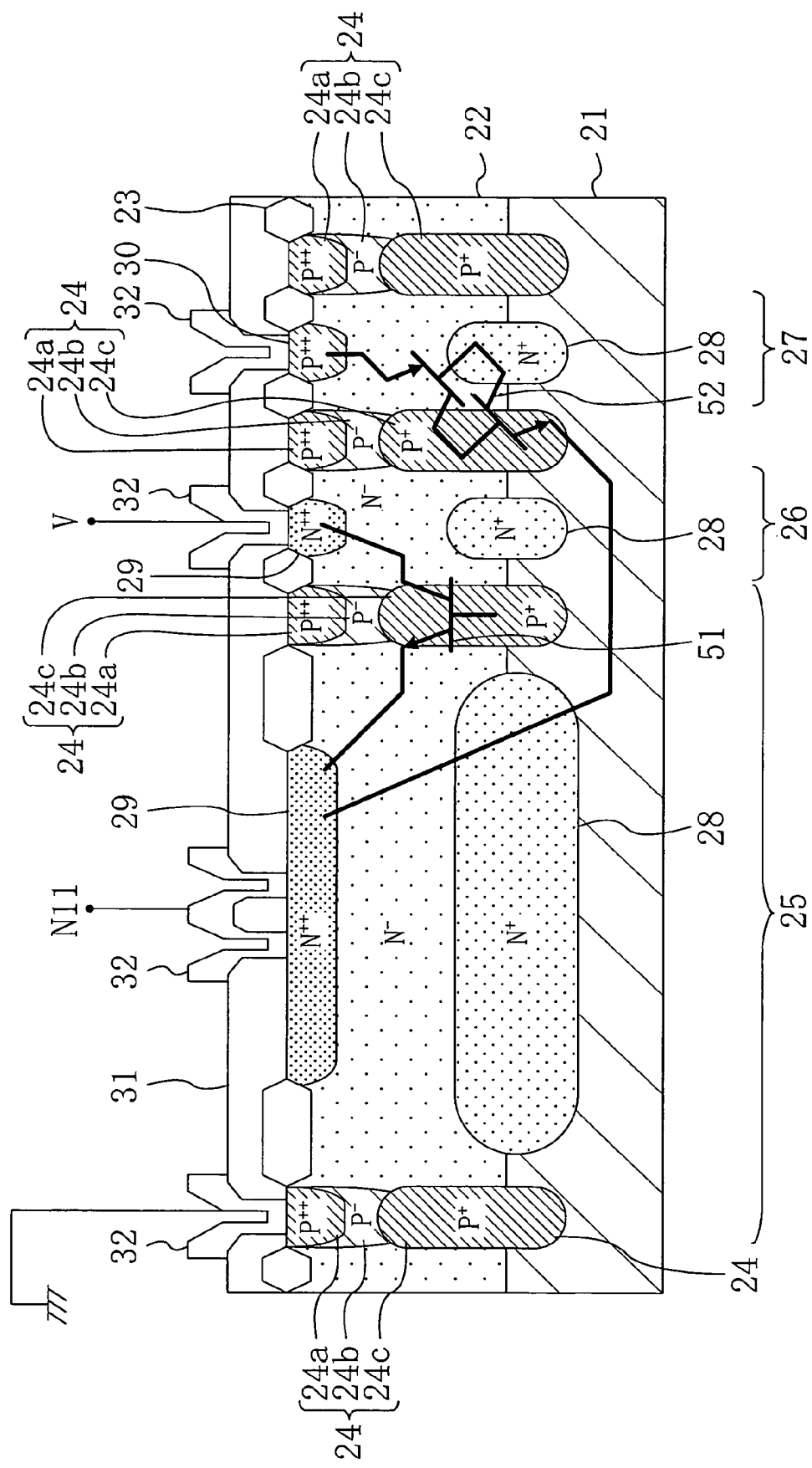
FIG. 9 is a view showing a cross section of a negative surge absorbing unit 13 and its periphery of the conventional semiconductor device.
Figure 10:
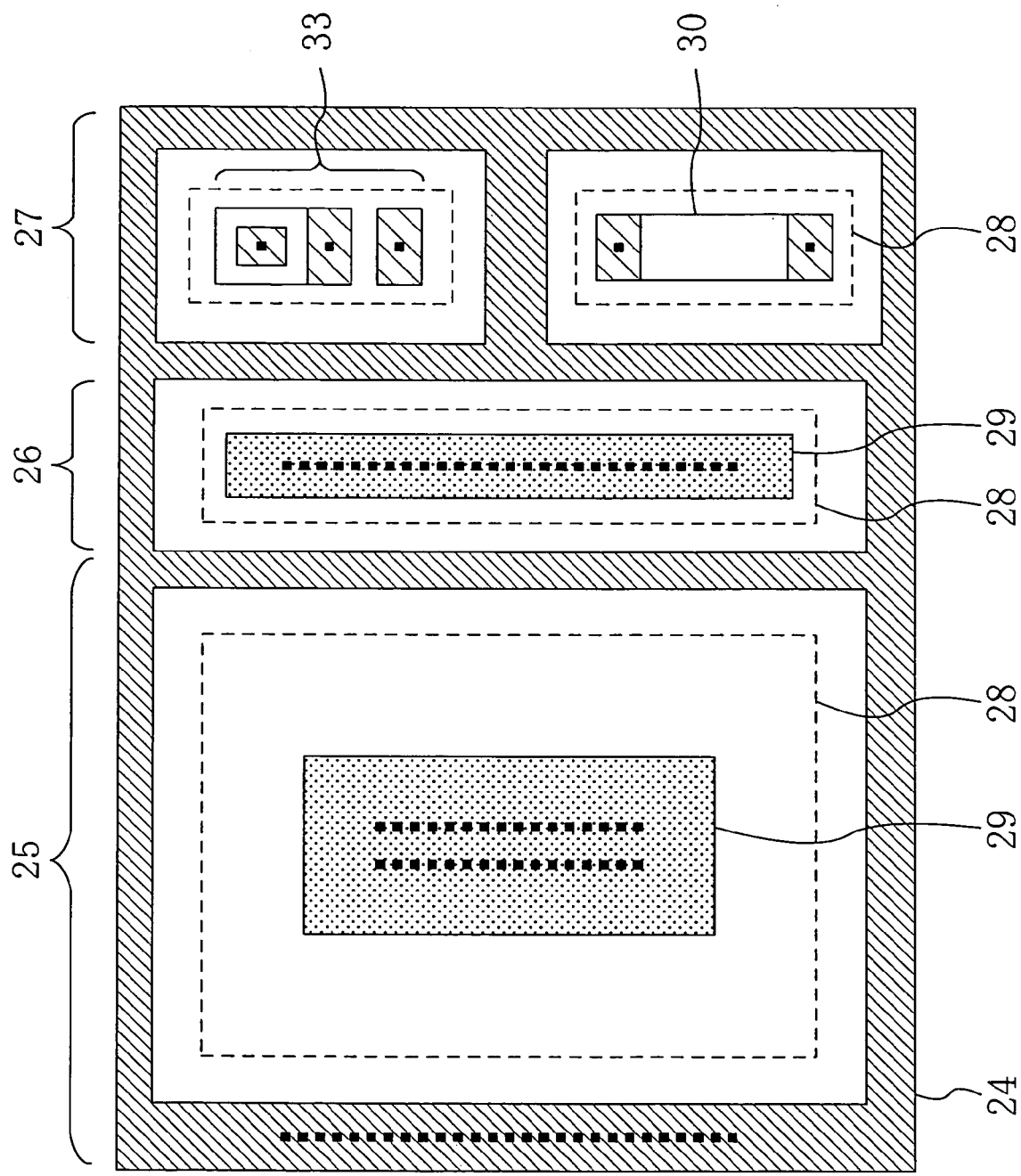
FIG. 10 is a view showing a plan configuration of the negative surge absorbing unit 13 and its periphery of the conventional semiconductor device.
Figure 11:
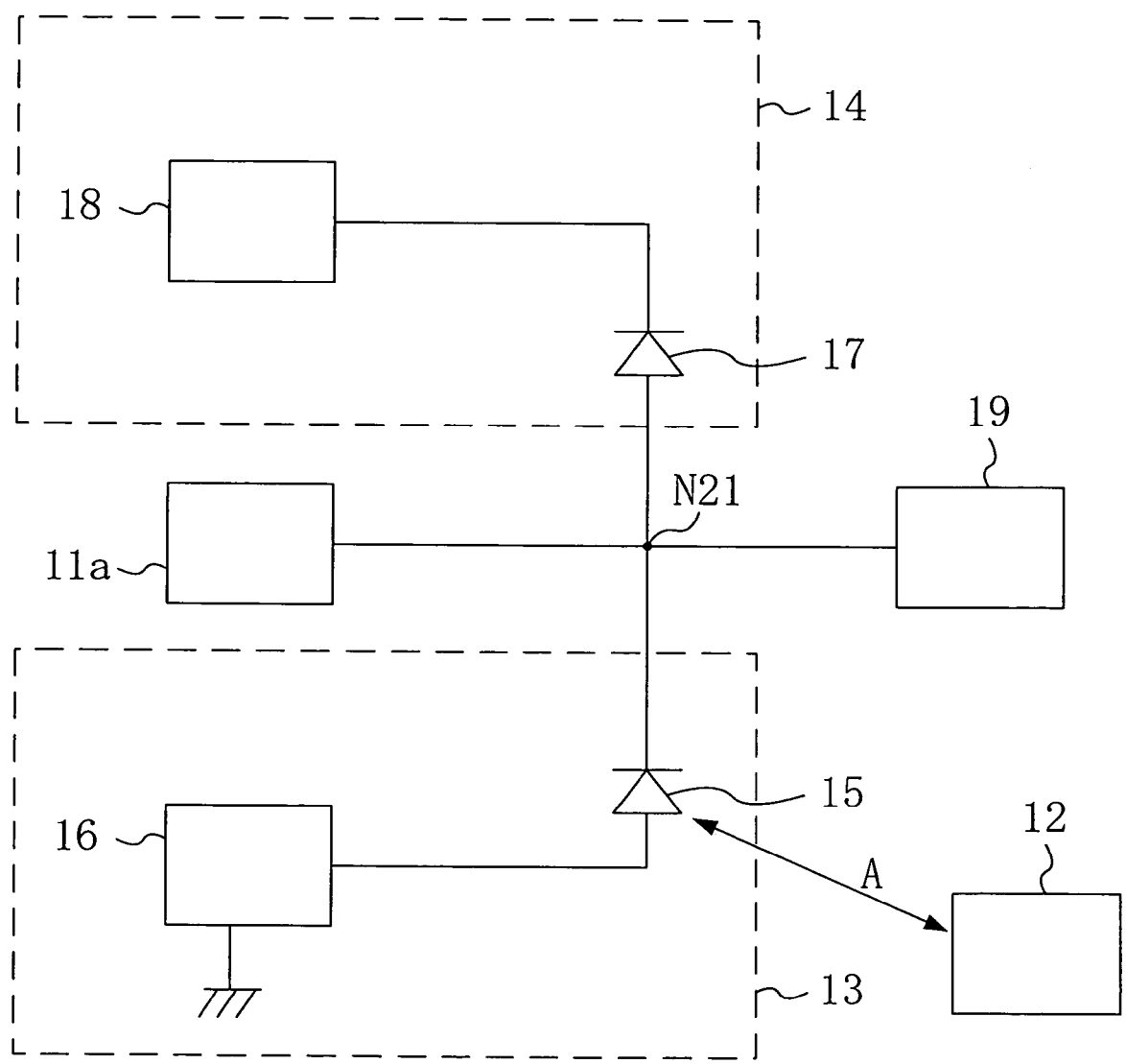
FIG. 11 is an equivalent circuit diagram of circuitry configured in another conventional semiconductor device.
Figure 12:
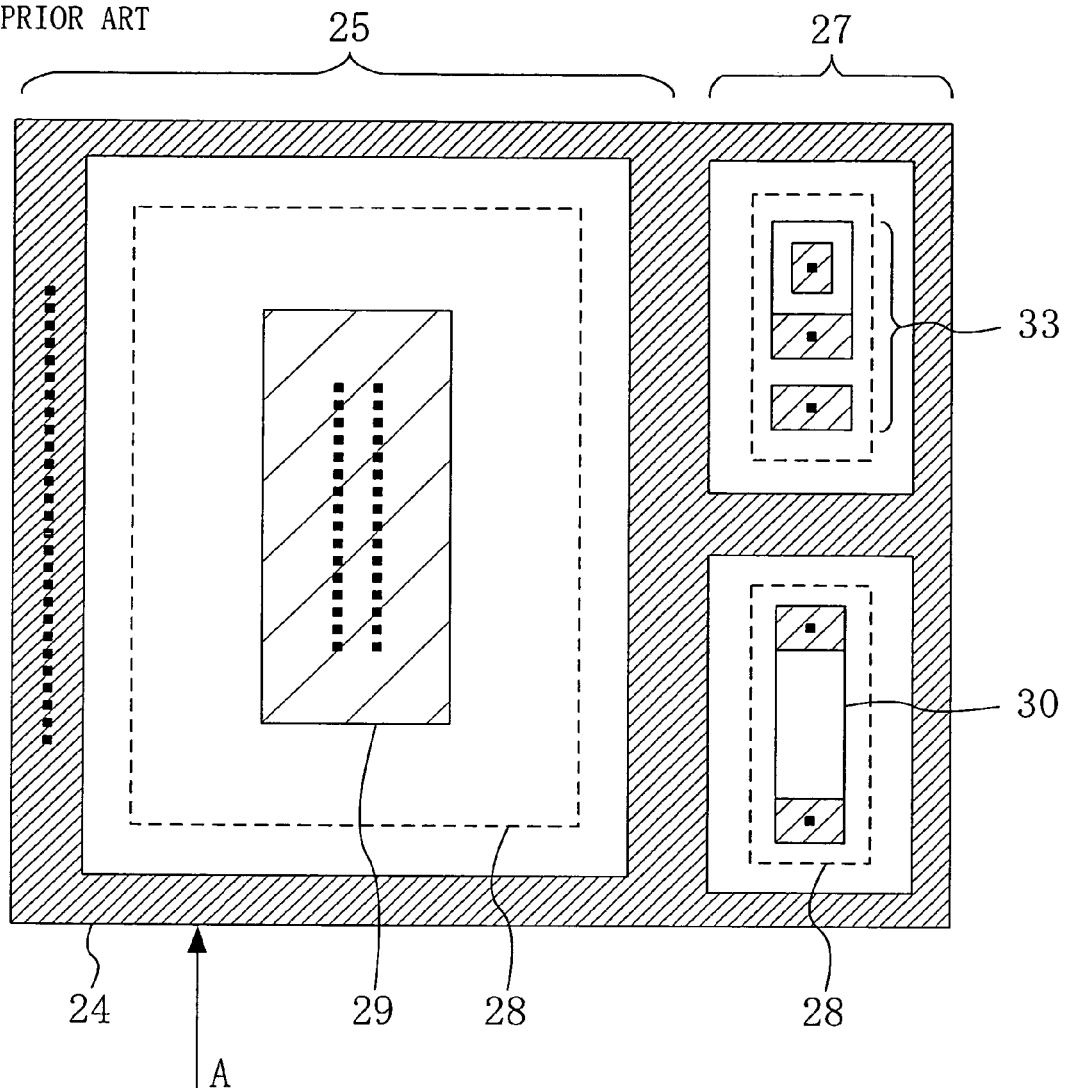
FIG. 12 is a view showing a cross section of a negative surge absorbing unit 13 and its periphery of another said conventional semiconductor device.

FIG. 7 is an equivalent circuit diagram of circuitry configured in a semiconductor device according to the fourth embodiment. This circuitry has a configuration in which a first protection resistance 111 and a second protection resistance 112 are additionally provided in the configuration shown in the equivalent circuit diagram in FIG. 1.

To be more specific, the first protection resistance 111 is connected between the connecting point N1 and the cathode 105K of the negative surge protection diode 105 in the negative surge absorbing unit 103. This connection can be formed using a p-type diffusion resistance, a polysilicon resistance formed on an insulating film, or the like. The resistance value of the first protection resistance 111 is determined in the following manner.

If a negative surge is applied to the output pad 101, a surge current flows from a ground potential terminal through the negative surge protection diode 105. Thus, by setting the resistance thereof at a value at which a voltage generated in the first protection resistance 111 by this surge current never exceeds the reverse breakdown voltage of the positive surge protection diode 107 and never constrains the surge current, the first protection resistance 111 with an appropriate resistance value can be provided. To be more specific, the appropriate resistance is, for example, 50 to 300 Ω.

In this device, the negative and positive surge absorbing units 103 and 104 can be configured similarly to the semiconductor device described in any of the first to third embodiments.

Thus, also in the semiconductor device of the fourth embodiment, like the semiconductor device in the first to third embodiments, the driver element 102 can be protected even if, for example, a surge is applied to the output pad 101. Simultaneously with this, operation of the parasitic thyristor can be prevented, which in turn avoids misoperation such as latch-up of the semiconductor device. Moreover, an increase in chip area and in fabrication costs can be suppressed.

In addition to the effects mentioned above, the semiconductor device of the fourth embodiment can further ensure protection against a surge as described below.

In the case of the circuitry shown in the equivalent circuit diagram of FIG. 1, it is conceivable that application of a positive surge to the output pad 101 exerts a voltage more than the breakdown voltage between the cathode 105K and the anode 105A of the negative surge protection diode 105. If such a phenomenon happens, an electric field in the cathode 105K of the negative surge protection diode 105 probably becomes high to break the negative surge protection diode 105.

However, in the case of the circuitry of the fourth embodiment shown in FIG. 7, the first protection resistance 111 is inserted between the output pad 101 and the negative surge protection diode 105. Thus, voltage drop can be produced across the first protection resistance 111 to limit a voltage applied to the cathode 105K. This limits the voltage applied to the cathode 105K at a value less than the breakdown voltage of the negative surge protection diode 105, whereby the breakdown of the negative surge protection diode 105 due to the applied positive surge can be prevented.

Likewise, the second protection resistance 112 may be formed in a similar manner to the first protection resistance 111, and its resistance value may be determined according to a positive surge which will flow through the positive surge absorbing unit 104. Thereby, breakdown of the positive surge protection diode 107 due to a negative surge can be prevented.

As described above, the semiconductor device of the fourth embodiment is designed as a semiconductor device in which misoperation is prevented even though the potential of the output pad 101 changes and in which breakdowns due to both the negative and positive surges are prevented.

Thus, with the present invention, an increase in element area and a decrease in design flexibility due to the presence of the protection diode can be suppressed. This suppresses an increase in chip area and thereby attains protection of the semiconductor device against a surge and prevention of misoperation. Consequently, the present invention is useful for semiconductor devices.

What is claimed is:

1. A semiconductor device comprising, above a semiconductor region of a first conductivity type,
    an output pad,
    a driver element connected to the output pad,
    a control circuit, and
    a surge absorption unit for preventing misoperation of the control circuit and protecting the driver element against a surge,
    wherein the surge absorption unit comprises:
    a semiconductor island region of a second conductivity type formed in or above the semiconductor region of the first conductivity type;
    a buried layer of the second conductivity type formed between the bottom of the semiconductor island region of the second conductivity type and the semiconductor region of the first conductivity type;
    a dopant layer of the first conductivity type formed in an upper portion of the semiconductor island region of the second conductivity type and electrically connected to have the same potential as the semiconductor region of the first conductivity type;
    a dopant layer of the second conductivity type formed in an upper portion of the dopant layer of the first conductivity type and electrically connected to the output pad; and
    a ring layer of the second conductivity type formed in the semiconductor island region of the second conductivity type to surround the dopant layer of the first conductivity type and to reach the buried layer of the second conductivity type,
    the ring layer of the second conductivity type is electrically connected to a terminal with a fixed potential and contains a dopant of the second conductivity type having a higher concentration than the semiconductor island region of the second conductivity type,
    the control circuit is arranged around the surge absorbing unit, and
    the dopant layer of the second conductivity type is electrically connected to an inductive load from outside through the output pad.

2. The device of claim 1,
    wherein the surge absorption unit is a negative surge absorbing unit for protecting the driver element against a negative surge,
    the first conductivity type is p-type and the second conductivity type is n-type, and
    the fixed potential is a potential equal to or higher than a ground potential.

3. The device of claim 1,
    wherein the surge absorption unit is a positive surge absorbing unit for protecting the driver element against a positive surge,
    the first conductivity type is n-type and the second conductivity type is p-type, and
    the fixed potential is a potential equal to or lower than a power supply potential.

4. The device of claim 1,
wherein the fixed potential is equal to a power supply potential.

5. The device of claim 1,
wherein the fixed potential is equal to a ground potential.

6. The device of claim 1,
wherein a resistance element is formed between the dopant layer of the second conductivity type and the output pad.

7. A semiconductor device comprising, above a semiconductor region of a first conductivity type,
an output pad,
a driver element connected to the output pad, and
a surge absorption unit for protecting the driver element against a surge,
wherein the surge absorption unit comprises:
a semiconductor island region of a second conductivity type formed in or above the semiconductor region of the first conductivity type;
a buried layer of the second conductivity type formed between the bottom of the semiconductor island region of the second conductivity type and the semiconductor region of the first conductivity type;
a dopant layer of the first conductivity type formed in an upper portion of the semiconductor island region of the second conductivity type and electrically connected to have the same potential as the semiconductor region of the first conductivity type;
a dopant layer of the second conductivity type formed in an upper portion of the dopant layer of the first conductivity type and electrically connected to the output pad; and
a ring layer of the second conductivity type formed in the semiconductor island region of the second conductivity type to surround the dopant layer of the first conductivity type and to reach the buried layer of the second conductivity type,
the ring layer of the second conductivity type is electrically connected to a terminal with a fixed potential and contains a dopant of the second conductivity type having a higher concentration than the semiconductor island region of the second conductivity type,
the device further comprising a high-resistive diffused layer which is formed between the perimeter and bottom of the dopant layer of the second conductivity type and the dopant layer of the first conductivity type and which contains a dopant of the second conductivity type having a lower concentration than the dopant layer of the second conductivity type,
wherein the concentration at the junction between the dopant layer of the first conductivity type and the high-resistive diffused layer is low.

8. A semiconductor device comprising, above a semiconductor region of a first conductivity type,
an output pad,
a driver element connected to the output pad, and
a surge absorption unit for protecting the driver element against a surge,
wherein the surge absorption unit comprises:
a semiconductor island region of a second conductivity type formed in or above the semiconductor region of the first conductivity type;
a buried layer of the second conductivity type formed between the bottom of the semiconductor island region of the second conductivity type and the semiconductor region of the first conductivity type;
a dopant layer of the first conductivity type formed in an upper portion of the semiconductor island region of the second conductivity type and electrically connected to have the same potential as the semiconductor region of the first conductivity type;
a dopant layer of the second conductivity type formed in an upper portion of the dopant layer of the first conductivity type and electrically connected to the output pad; and
a ring layer of the second conductivity type formed in the semiconductor island region of the second conductivity type to surround the dopant layer of the first conductivity type and to reach the buried layer of the second conductivity type,
the ring layer of the second conductivity type is electrically connected to a terminal with a fixed potential and contains a dopant of the second conductivity type having a higher concentration than the semiconductor island region of the second conductivity type,
the device further comprising a buried layer of the first conductivity type which is provided between the bottom of the dopant layer of the second conductivity type and the buried layer of the second conductivity type and which contains a dopant of the first conductivity type having a higher concentration than the dopant layer of the first conductivity type.

9. The device of claim 1, further comprising a plurality of contacts arranged in ring form over the entire surface of the ring layer of the second conductivity type,
wherein the ring layer of the second conductivity type is electrically connected to the terminals with the fixed potential through the plurality of contacts.

* * * * *